US011081855B2

(12) United States Patent
Dumond (10) Patent No.: US 11,081,855 B2
(45) Date of Patent: Aug. 3, 2021

(54) LASER-MOPA WITH BURST-MODE CONTROL

(71) Applicant: Coherent, Inc., Santa Clara, CA (US)

(72) Inventor: Gregory Dumond, Santa Clara, CA (US)

(73) Assignee: Coherent, Inc., Santa Clara, CA (US)

( * ) Notice: Subject to any disclaimer, the term of this patent is extended or adjusted under 35 U.S.C. 154(b) by 493 days.

(21) Appl. No.: 16/011,310

(22) Filed: Jun. 18, 2018

(65) Prior Publication Data
US 2019/0386450 A1 Dec. 19, 2019

(51) Int. Cl.
| H01S 3/23 | (2006.01) |
| H01S 3/067 | (2006.01) |
| H01S 3/106 | (2006.01) |
| H01S 5/065 | (2006.01) |
| H03M 1/74 | (2006.01) |

(52) U.S. Cl.
CPC ........ *H01S 3/2308* (2013.01); *H01S 3/06754* (2013.01); *H01S 3/1068* (2013.01); *H01S 5/0657* (2013.01); *H03M 1/74* (2013.01)

(58) Field of Classification Search
CPC ... H01S 3/2308; H01S 3/06754; H01S 3/0085
See application file for complete search history.

(56) References Cited

U.S. PATENT DOCUMENTS

| 6,552,301 | B2 | 4/2003 | Herman et al. | |
| 6,781,537 | B1* | 8/2004 | Taraschuk | H03M 1/0836 341/137 |
| 8,073,027 | B2 | 12/2011 | Deladurantaye et al. | |
| 8,411,716 | B2 | 4/2013 | Jacob et al. | |
| 9,296,066 | B2 | 3/2016 | Hosseini et al. | |
| 2009/0067455 | A1* | 3/2009 | Murison | H01S 3/1003 372/20 |
| 2010/0177794 | A1* | 7/2010 | Peng | H01S 3/2316 372/25 |
| 2010/0197116 | A1* | 8/2010 | Shah | H01L 21/268 438/463 |
| 2016/0197451 | A1 | 7/2016 | Kraemer et al. | |

(Continued)

FOREIGN PATENT DOCUMENTS

EP 1617530 A2 1/2006

OTHER PUBLICATIONS

International Search Report and Written Opinion received for PCT Patent Application No. PCT/US2019/037671, dated Sep. 27, 2019, 16 pages.

(Continued)

*Primary Examiner* — Eric L Bolda
(74) *Attorney, Agent, or Firm* — Morrison & Foerster LLP (57) ABSTRACT

A laser master-oscillator power-amplifier (MOPA) is operated to provide successive bursts of ultrashort pulses. The pulse-bursts are selected by an optical modulator from a pulse train delivered by the master oscillator prior to amplification in the power amplifier. The optical modulator has a selectively variable transmission specified by an analog voltage signal having a stepped waveform. The voltage signal is delivered by a sequentially-switched parallel switch-array connected in parallel with a parallel DAC having multiple parallel DC voltage outputs corresponding to steps of the stepped waveform.

20 Claims, 6 Drawing Sheets

(56) References Cited

U.S. PATENT DOCUMENTS

2017/0187160 A1    6/2017  Lowder et al.

OTHER PUBLICATIONS

Korner et al., "Temporal Shaping of High Peak Power Pulse Trains from a Burst-Mode Laser System", Applied Sciences, vol. 5, 2015, pp. 1790-1802.
Rezaei et al., "Burst Train Generator of High Energy Femtosecond Laser Pulses for Driving Heat Accumulation Effect during Micromachining", Optics Letters, vol. 40, No. 9, May 1, 2015, pp. 2064-2067.
Baird et al., "Tandem Protonic Amplifier Employing a Pulsed Master Oscillator Fiber Power Amplifier With Programmable Temporal Pulse Shape Capability", Proc. of SPIE, vol. 6871, 2008, pp. 68712A-1-68712A-7.
Deladurantaye et al., "140 µJ, Narrow Linewidth, Robustly Single-Transverse Mode Nanosecond Infrared Fiber Laser Platform with Fine Pulse Tailoring Capability", Proc. of SPIE, vol. 7386, 2009, pp. 73860Q-1-73860Q-10.
Deladurantaye et al., "Material Micromachining using a Pulsed Fiber Laser Platform With Fine Temporal Nanosecond Pulse Shaping Capability", Proc. of SPIE, vol. 7195, 2009, pp. 71951S-1-71951S-12.
Desbiens et al., "Flexible and Programmable Pulse Shaping MOPA Fiber Laser Platform, Performances and Applications", The Review of Laser Engineering, vol. 41, No. 9, Sep. 2013, pp. 1-6.
Desbiens et al., (2013). "Flexible and Programmable Pulse Shaping MOPA Fiber Laser Platform, Performances and Applications," The Review of Laser Engineering, 41(9):1-6.

* cited by examiner

LASER-MOPA WITH BURST-MODE CONTROL

TECHNICAL FIELD OF THE INVENTION

The present invention relates in general to master-oscillator power-amplifier (MOPA) apparatus. The invention relates in particular to MOPA apparatus delivering bursts of ultrashort laser-radiation pulses. For example, laser pulses having a duration between about 200 femtoseconds (fs) and about 20 picoseconds (ps), with a temporal separation between pulses of up to about 40 nanoseconds (ns).

DISCUSSION OF BACKGROUND ART

Burst-mode operation is advantageous for certain laser machining applications. For example, laser scribing or laser cutting of brittle materials. An example of such an application is cutting chemically-strengthened glass sheets for making display screens for consumer electronic devices, such as "smart-phones". Burst-mode operation of a laser apparatus is described in U.S. Pat. No. 6,552,301. Cutting of glass using burst-mode laser apparatus is described in U.S. Pat. No. 9,296,066.

A favored laser-MOPA apparatus for burst-mode machining is a fiber-MOPA, wherein a continuous train of individual "seed" pulses is generated by a mode-locked laser or a rapidly pulsed diode-laser. A typical pulse repetition frequency (PRF) is 80 megahertz (MHz), corresponding to a pulse separation of 12.5 ns. Bursts of seed pulses may be selected on demand or at pre-determined intervals from the continuous train of seed pulses by a device commonly referred to as a "pulse-picker" by practitioners of the art. An acousto-optic modulator (AOM) is commonly used as pulse-picker. A typical burst has up to 10 seed pulses. A typical time interval between the bursts is 1 µs (microsecond). The selected bursts of seed pulses are then amplified by one or more fiber-amplifiers. Each fiber-amplifier has an optical fiber as a gain medium. Each optical fiber is energized through optical pumping by one or more diode-lasers.

A shortcoming of burst-mode pulse-amplification is that the relatively short time interval between pulses can lead to energy stored in the amplifier being depleted at a rate faster than the amplifier can be energized through optical pumping. Absent any measure to prevent this, a consequence is that energy and peak-power of individual amplified pulses diminishes throughout a burst. Such a progressive decline in energy may make a burst of pulses less effective in a laser machining application, particularly in an application that has a threshold energy. This shortcoming, of course, may also determine a maximum number of pulses that can be usefully included in a burst.

One measure to prevent a progressive decline in pulse energy during a burst is described in U.S. Pat. No. 8,073,027. The measure involves amplitude regulation of seed-pulses within a burst prior to amplification, such that the amplified pulses in the amplified burst have the same amplitude. An AOM may be used for this regulation of the seed-pulses. Optical regulation provided by an AOM depends on the amplitude of an oscillating electric potential applied to the AOM by a radio-frequency (RF) electrical driver. Commercial AOM drivers are available that convert an analog electrical control signal into analog regulation of the amplitude of the RF electric potential.

To enable automated regulation and particularly computer regulation, a digital electrical control signal must be converted into an analog electrical control signal by a digital-to-analog converter (DAC). The conversion rate is determined by the temporal separation of the seed-pulses, which can be as short as a few nanoseconds, as noted above. This requires a DAC with a correspondingly fast response time. Such serial DACs are commercially available, but at a cost which can be a significant fraction of the total cost of the MOPA apparatus. There is a need for a method and apparatus for regulating seed-pulses that does not rely on a fast-response serial DAC for processing regulation instructions.

SUMMARY OF THE INVENTION

In one aspect, optical apparatus in accordance with the present invention comprises a pulsed seed laser generating a train of seed pulses having a pulse repetition frequency, an optical modulator, an optical amplifier, a parallel digital-to-analog converter, and a parallel switch-array. The optical modulator is arranged to receive the train of seed pulses from the pulsed seed laser and to form a burst of seed pulses by selecting a plurality of consecutive seed pulses from the train of seed pulses. The optical modulator has an optical transmission specified by an analog modulation signal having a stepped waveform. The optical amplifier is arranged to receive the burst of seed pulses from the optical modulator and to amplify the seed pulses. The parallel digital-to-analog converter has a plurality of output channels providing direct current voltages that correspond to voltage steps of the stepped waveform. The parallel switch-array is connected in parallel with the output channels of the parallel digital-to-analog converter and arranged to deliver the analog modulation signal to the optical modulator.

The stepped waveform is formed by sequential switching of the parallel switch-array between the output channels of the parallel digital-to-analog converter.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
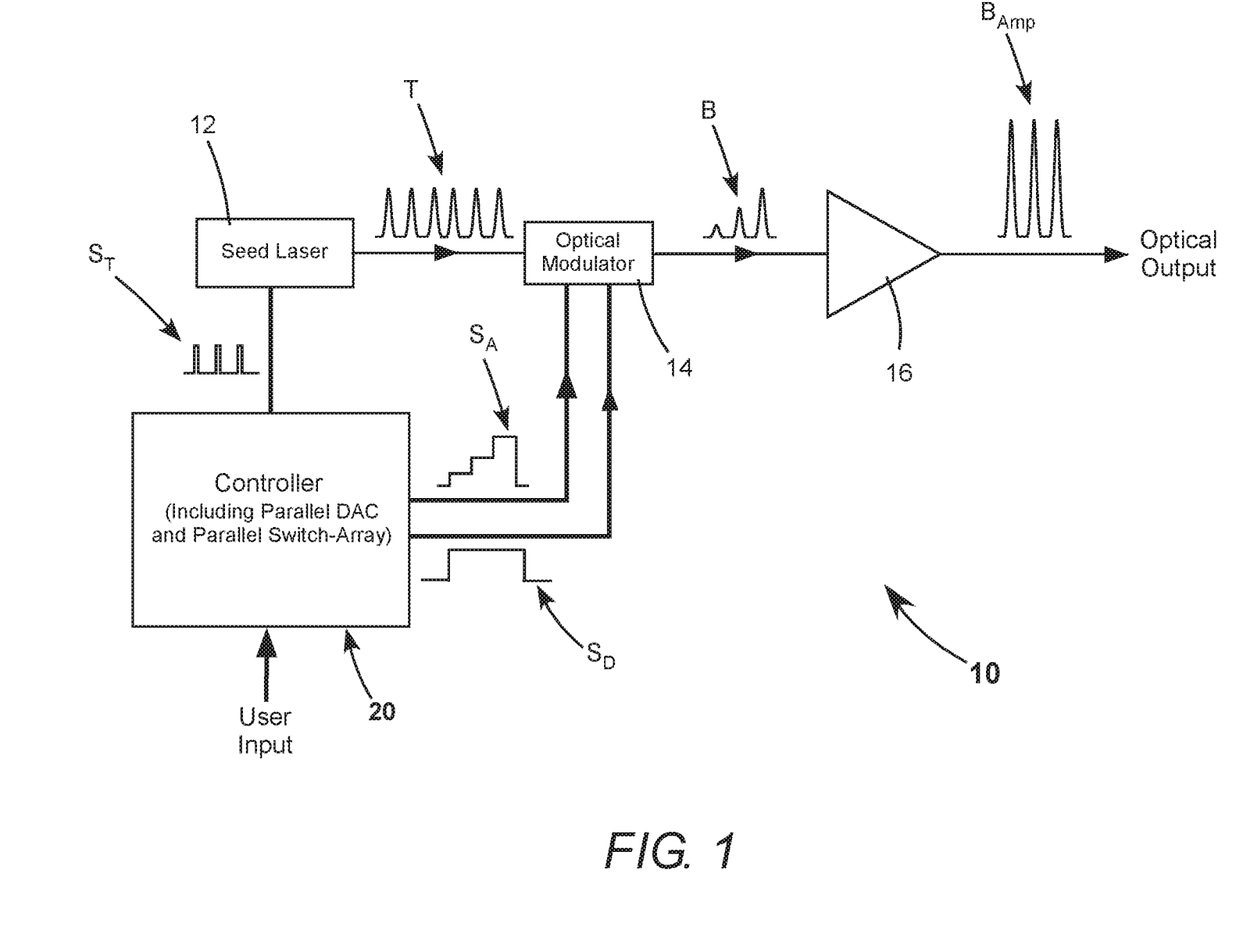
FIG. 1 schematically illustrates a preferred embodiment of laser MOPA apparatus in accordance with the present invention, including a pulsed seed laser delivering a continuous train of laser-radiation seed-pulses, an optical modulator arranged to select a burst having a predetermined number of the seed pulses from the pulse-train, an optical amplifier arranged to amplify the seed pulses in the selected bursts, and a controller that operates the optical modulator such that the amplitudes of individual seed pulses in the burst thereof increase progressively to cause the amplified pulses in the burst thereof to have about equal amplitude.

Turning now to the drawings, wherein like features are designated by like reference numerals, FIG. 1 schematically illustrates a preferred embodiment 10 of laser MOPA apparatus in accordance with the present invention. In this drawing, optical paths are depicted by fine solid lines and electrical paths are depicted by bold solid lines.

Apparatus 10 includes a pulsed seed laser 12 delivering a continuous train T of laser-radiation seed-pulses at a high PRF. Preferably, the seed pulses have a PRF of between about 20 MHz and about 100 MHz, and most preferably a PRF of between about 40 MHz and about 80 MHz. Train of seed pulses T is delivered to an optical modulator 14, which is arranged to select a burst B having a predetermined number of the seed pulses from the train of seed pulses. Pulse-burst B is delivered to an optical amplifier 16 arranged to amplify the seed-pulses in the selected bursts. Optical amplifier 16 delivers a burst $B_{Amp}$ of amplified pulses, which are depicted here having about equal amplitude.

A burst of three seed pulses is depicted in FIG. 1, but bursts of up to twelve seed pulses or even up to twenty four seed pulses may be useful in laser processing applications All bursts and signals, herein, are depicted using a convention that time progresses from left to right. In bursts B and $B_{Amp}$, for example, the leftmost pulse is the first pulse in the burst and the rightmost pulse is the last pulse in the burst.

Optical Modulator 14 is controlled by an analog modulation signal $S_A$, having periodic amplitude changes that together form a stepped waveform. A binary digital signal $S_D$ enables the optical modulator during delivery of analog modulation signal $S_A$ and disables the optical modulator at other times. Signals $S_A$ and $S_D$ are generated by a controller 20, described in detail hereinbelow. In apparatus 10, signals $S_A$ and $S_D$ are electrical signals, with the amplitude changes of analog modulation signal $S_A$ being voltage steps.

The exemplary analog modulation signal $S_A$ in FIG. 1 is selected to operate optical modulator 14 such that the amplitudes of the individual seed pulses in pulse-burst B increase progressively to compensate for a progressive depletion of gain in optical amplifier 16. This compensation provides amplified pulses in the corresponding amplified burst $B_{Amp}$ that have about equal amplitude; what may be described as a "flat" or "uniform" amplitude profile. The periodic amplitude changes of analog modulation signal $S_A$ are created by an inventive combination of a parallel DAC and a fast switch-array, which are not explicitly depicted in FIG. 1.

It should be noted, here, that only sufficient details of pulsed seed laser 12, optical modulator 14, and optical amplifier 16, are provided for understanding principles of the present invention. Those familiar with laser technology will recognize that pulsed seed laser 12 may be a solid-state laser, a semiconductor laser, or a fiber laser. The pulsed seed laser may also include one or more stages of pre-amplification. Optical modulator 14 may be a free-space modulator or a fiber-coupled modulator. Optical modulator 14 may be an AOM modulator or an electro-optical (EO) modulator. Optical amplifier 16 may be a solid-state amplifier, a fiber amplifier, or a combination thereof, having one or more amplifier stages.

It should also be noted, here, that an AOM optical modulator would include a RF power supply generating an oscillating electric potential, as is known in the art. Similarly, an EO optical modulator would include a power supply generating a high voltage to regulate optical transmission through the optical modular. The power supply of optical modulator 14 is not depicted separately for simplicity of illustration. For an AOM optical modulator, the amplitude of the oscillating electric potential and the corresponding optical transmission are about proportional to analog modulation signal $S_A$.

A digital timing-signal $S_T$, communicated between pulsed seed laser 12 and controller 20, synchronizes the voltage steps of analog modulation signal $S_A$ with respect to the arrival of seed pulses at optical modulator 14. Digital signal $S_D$ initiates and terminates operation of optical modulator 14, thereby determining the length of pulse-burst B, i.e. the number of pulses in pulse-burst B. User input to controller 20 includes, inter alia, a desired number of pulses in a burst, a desired amplitude of the pulses in the amplified burst, and a desired time-interval between successive bursts.

If pulsed seed laser 12 includes a mode-locked resonator having a PRF determined by a length of the mode-locked resonator, timing signal $S_T$ would be derived by sampling pulse-train T with a fast photodiode. Timing signal $S_T$ would be provided from pulsed seed laser 12 to controller 20. If the pulsed seed laser includes a directly-driven laser, such as a semiconductor laser, the timing signal would be generated by a clock in the controller. Timing signal $S_T$ would be provided from the controller to the pulsed seed laser, with the timing signal setting the PRF of the pulsed seed laser. The timing signal is also provided to components of controller 20 that generate analog modulation signal $S_A$.

Figure 2:
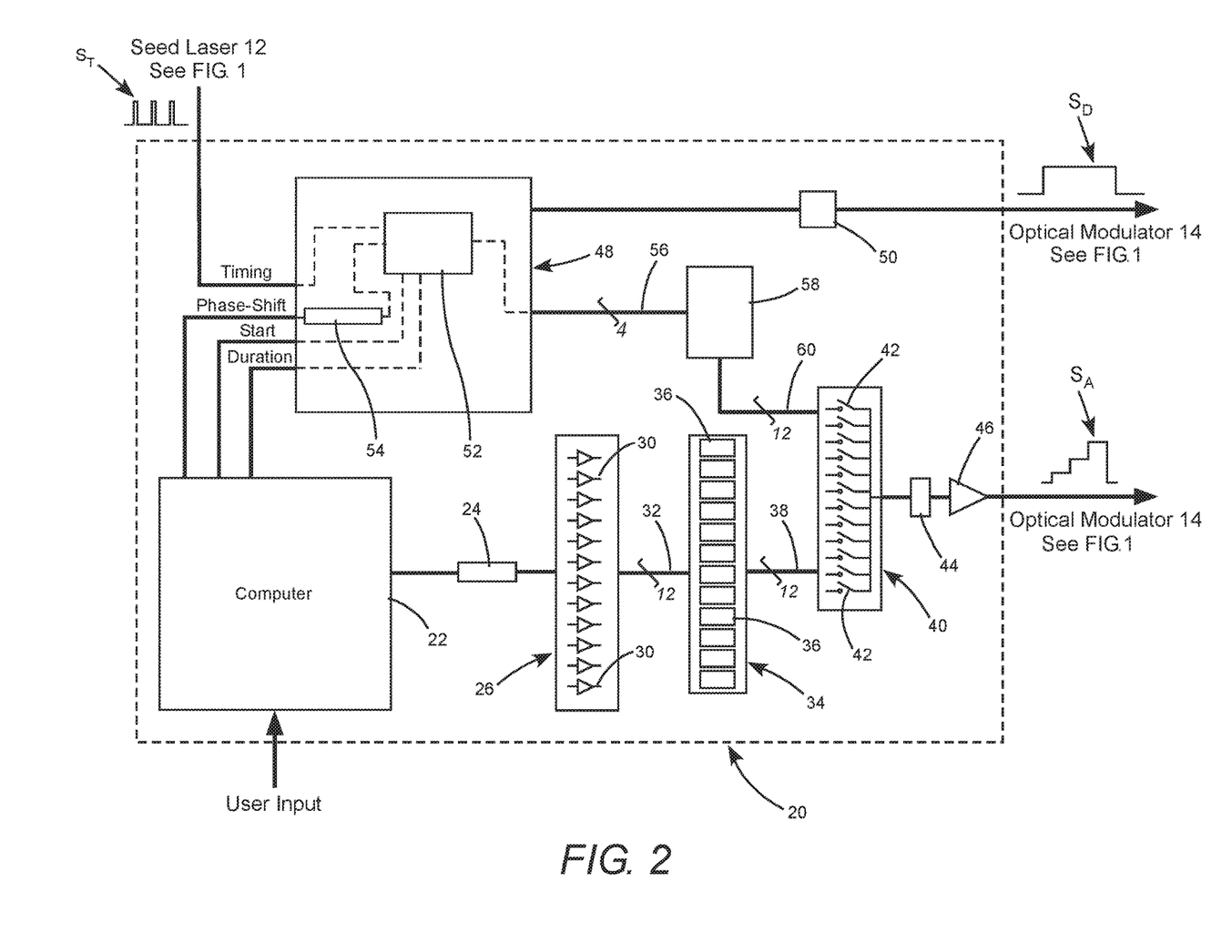
FIG. 2 is an electrical block-diagram schematically illustrating a preferred arrangement of the controller of FIG. 1, including a twelve-channel parallel DAC providing twelve DC voltages to a parallel switch-array having twelve individual switches, the individual switches forming an analog modulation signal by rapid sequential switching, the analog modulation signal delivered serially from the parallel switch-array to the optical modulator of FIG. 1 to create the progressively increasing amplitudes of the seed-pulses.

FIG. 2 is an electrical block-diagram schematically illustrating a preferred arrangement of controller 20 of FIG. 1. Here, controller 20 includes a computer 22 responsive to the above-discussed user input. One device suitable for use as computer 22 is a user-programmable single-board computer, such as a Colibri T20 model 241200 computer module, which is available from Toradex Inc. of Seattle, Wash.

Computer 22 communicates via a serial peripheral interface (SPI) bus 24 with a parallel DAC 26, here having twelve analog output channels 30. Parallel DACs are commercially available from various suppliers, with devices having eight, twelve, or sixteen output channels being common. During operation of apparatus 10, each output channel 30 provides a direct current (DC) voltage that determines the amplitude of one seed pulse in a burst thereof. Twelve output channels enables amplitude modulation of individual pulses in a burst having up to twelve pulses, which would be sufficient for most practical laser processing applications. Computer 22 communicates a digital signal through SPI bus 24 to control the output voltages of parallel DAC 26.

Voltages on output channels 30 of parallel DAC 26 are communicated via a twelve-line parallel connection 32 to an array 34 of twelve low-pass filters 36. The filtered voltages are communicated from filter array 34 via another twelve-line parallel connection 38 to a parallel switch-array 40 having twelve individual switches 42. One integrated device suitable for use as parallel switch-array 40 is part number NL7WB66, which is available from ON Semiconductor of Phoenix, Ariz. Parallel connections 32, 38, and others discussed herein are designated by a slash-like symbol and the number of lines in the connection, as is customary in the electronics art. The number designating the number of parallel lines is italicized to differentiate that number from a traditional reference numeral.

Switches 42 are activated sequentially, thereby communicating the filtered voltages from filter array 34 sequentially to optical modulator 14 of FIG. 1 via a low-pass filter 44 and a buffer amplifier 46. Rapid sequential switching of parallel switch-array 40 thereby forms analog modulation signal $S_A$, having a progressively increasing stepped waveform in the example depicted in FIGS. 1 and 2.

For an AOM modulator, analog modulation signal $S_A$ would typically be TTL compatible and capable of driving a 50Ω (ohm) or 75Ω load impedance. Typical voltage ranges are from 0 V to 1 V and from 0 V to 5 V, as specified by a RF power supply manufacture. An important consideration for modulating optical pulses having a PRF of between about 20 MHz and about 100 MHz is that the rapid operation of individual switches 42 could cause undesirable signal bounce and distortion. Filter array 34 located in the parallel connection from parallel DAC 26 and low-pass filter 44 located in the serial connection to optical modulator 14 both mitigate signal bounce and distortion. Buffer amplifier 46 provides impedance matching.

Controller 20 further includes a field-programmable gate-array (FPGA) 48, which includes a counter-encoder 52 and a phase-shift clock 54. One preferred FPGA is part number EP3C5E144C7N, which is available from Altera Corporation of San Jose, Calif. Computer 22 communicates a required start time of a burst, a required duration of a burst, and a desired phase shift for operation of parallel switch-array 40 relative to arrival of seed pulses in pulse-train T at optical modulator 14. Timing-signal $S_T$ communicates the delivery of seed pulses from pulsed seed laser 12. The signals are communicated within FPGA 48 to counter-encoder 52.

An encoded digital signal representing a number of switches 42 to be operated in sequence is communicated from counter-encoder 52 in FPGA 48 via a four-line parallel connection 56 to a decoder 58. Decoder 58 is connected to parallel switch-array 40 via a twelve-line parallel connection 60, with one line for each switch 42. Signals sent from decoder 58 through parallel connection 60 open and close individual switches. The switches are sequentially operated to generate signal $S_A$. The phase-shift signal input to phase-shift clock 54 in FPGA 48 provides that the switching sequence is synchronized with respect to the seed pulses, such that switching occurs between pulses in a burst thereof. That synchronization is achieved by advancing or retarding the encoded digital signal to be communicated through parallel connection 56. FPGA 48 also provides digital signal $S_D$, via a 50Ω or 75Ω driver 50, to turn the modulator on and off as discussed above. Digital signal $S_D$ similarly may be advanced or retarded, if necessary.

Phase-shift clock 54 could be a shift register. For example, a shift register that effectively advances or delays timing signal $S_T$ for generating the encoded digital signal by 4 ns increments. At a PRF of 50 MHz, seed pulses are temporally separated by 20 ns, while ultrashort pulses generally have a duration of less than 20 ps and ultrashort pulses generated by a mode-locked laser usually have a duration of less than 1 ps. Accordingly, even considering a possible switching time of about 2 ns, the stepwise changes in optical transmission of optical modulator 14 can be well-separated from seed pulses being received by the optical modulator.

Figure 3A:
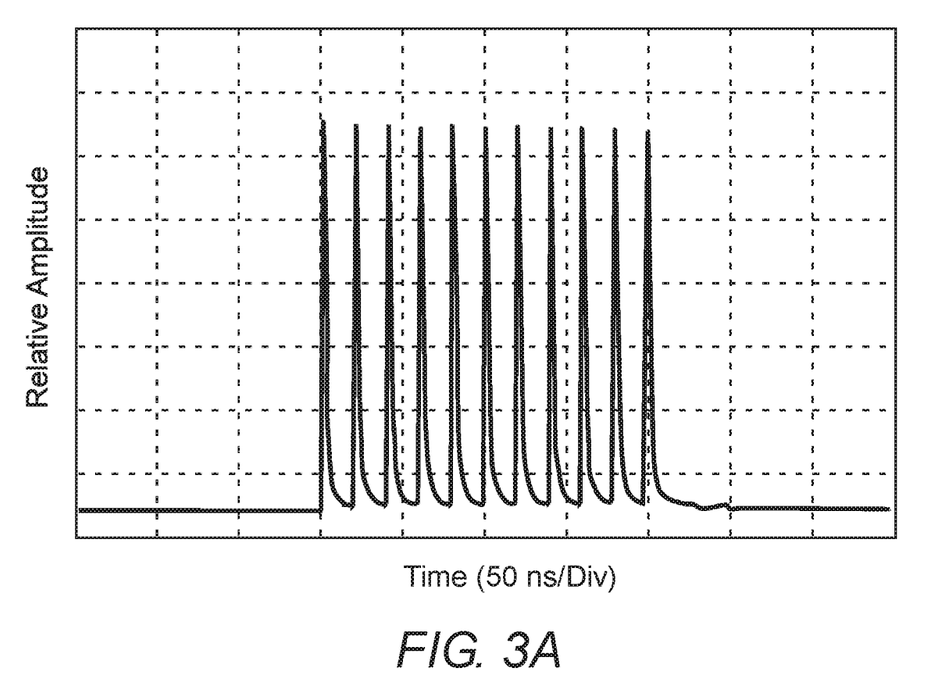
FIG. 3A is a graph schematically illustrating measured relative amplitude as a function of a time for an amplified burst of eleven pulses, having nominally equal amplitude and equal temporal spacing, generated in the apparatus of FIG. 1.

FIG. 3A is a graph schematically illustrating measured relative amplitude as a function of time for an amplified burst of eleven pulses, having nominally equal amplitude and equal temporal spacing, generated in an example of apparatus 10 of FIG. 1. Pulsed seed laser 12, in this example, is a mode-locked fiber-laser delivering seed-pulses at a PRF of 50 MHz. The pulses have a duration of about 300 fs. Optical modulator 14 is a fiber-coupled AOM modulator arranged such that a maximum applied RF voltage results in a maximum optical transmission, here, defining 100% optical transmission. Optical amplifier 16 is a two-stage fiber amplifier. Average output power of the exemplary laser MOPA is about 42 watts (W), with the amplified bursts delivered at a burst-repetition frequency (BRF) of 200 kilohertz (kHz).

Figure 3B:
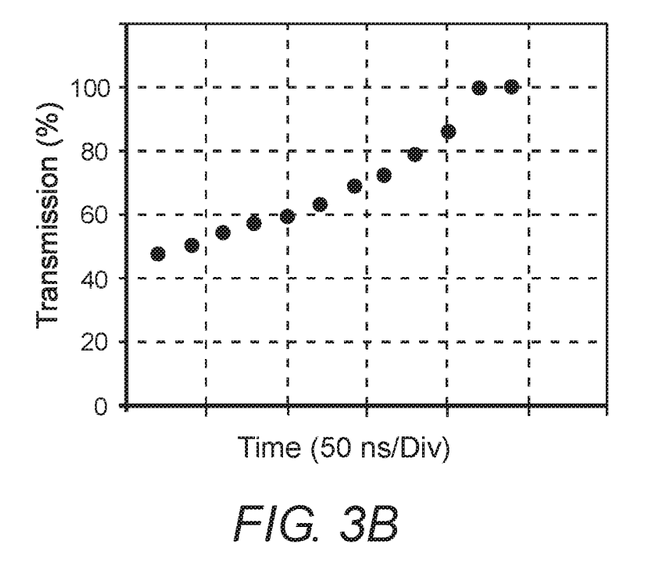
FIG. 3B is a graph schematically illustrating optical transmission of the optical modulator as a function of time during the generation of the amplified burst of FIG. 3A.

FIG. 3B is a graph schematically illustrating optical transmission of optical modulator 14 as a function of time during the generation of the amplified burst of FIG. 3A. The optical transmission levels are those when successive pulses in pulse-train T arrive at the optical modulator and result from sequential switching of parallel switch-array 40 of FIG. 2. Optical transmission is proportional to the applied RF voltage, the voltage steps of analog modulation signal SA, and the corresponding output voltages of parallel DAC 26. The time-progressive percentage transmissions levels, here, are 47.8, 50.1, 54.5, 57.5, 59.6, 63.5, 69.0, 72.3, 79.0, 86.0, 100.0, and 100.0, rounded to one decimal place.

There are twelve optical transmission levels in the example depicted. The twelfth level, here, is redundant as the modulator is turned off by digital signal $S_D$ after the eleventh pulse is communicated by the optical modulator. The twelfth voltage level could be used to set (or reset) the optical modulator to a specific optical transmission, which is here 100% transmission. This allows the optical modulator to be used in other modulation modes, having a fixed optical transmission and controlled only by digital signal $S_D$.

Figure 4A:
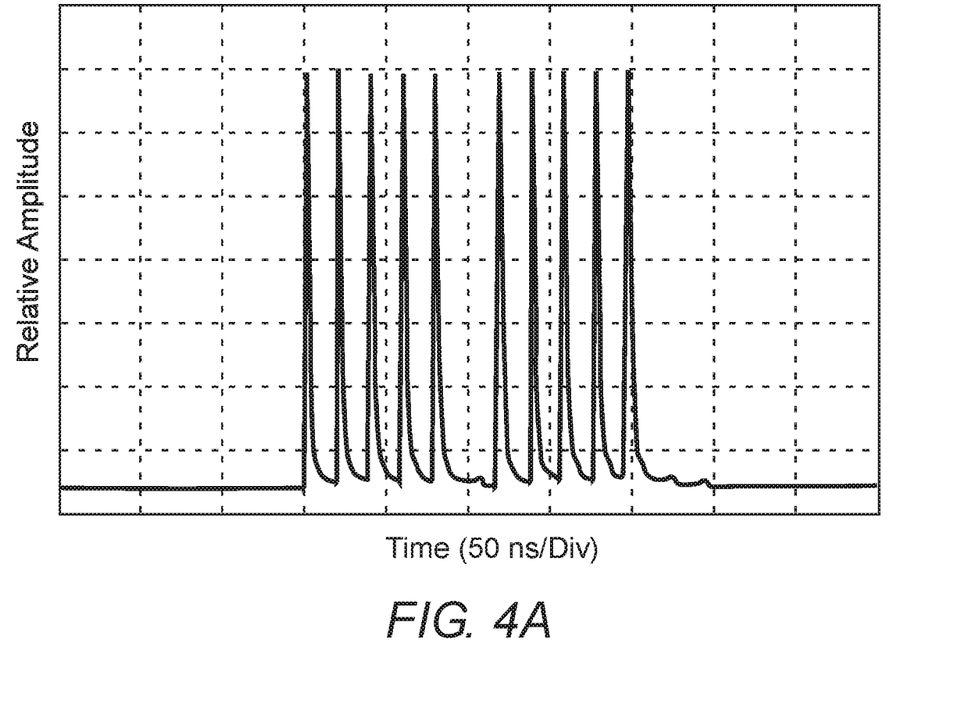
FIG. 4A is a graph schematically illustrating measured relative amplitude as a function of a time for an amplified burst of ten pulses, similar to the eleven-pulse burst of FIG. 3A, with an exception that the fifth and sixth pulses have twice the temporal spacing of other consecutive pulses in the burst.

FIG. 4A is a graph schematically illustrating measured relative amplitude as a function of time for an amplified burst of ten pulses, having nominally equal amplitude, generated in the example of the apparatus of FIG. 1 discussed above with reference to FIGS. 3A and 3B. The ten-pulse burst is similar to the eleven-pulse burst of FIG. 3A, with an exception that the fifth and sixth pulses have twice the temporal spacing of other consecutive pulses in the burst. The average output power is again about 42 W and the BRF is again 200 kHz.

Figure 4B:
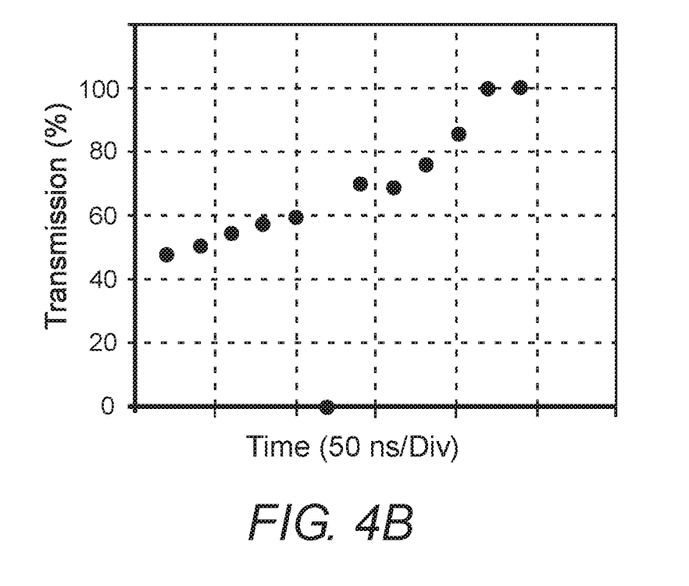
FIG. 4B is a graph schematically illustrating optical transmission of the optical modulator as a function of time during the generation of the amplified burst of FIG. 4A.

FIG. 4B is a graph schematically illustrating optical transmission of the optical modulator as a function of time during the generation of the amplified burst of FIG. 4A. In order to prevent generation of a pulse between the fifth and sixth pulses, the sixth DC analog voltage level from the parallel DAC of FIG. 2 is set to zero, thereby creating a 0 V step in the waveform analog modulation signal $S_A$. The time-progressive percentage transmission levels, here, are 47.4, 50.6, 54.8, 57.8, 60.4, 00.0, 70.0, 69.0, 76.0, 84.0, 100.0, and 100.0, rounded to one decimal place.

While the present invention generates bursts of amplified pulses having about equal amplitude, as discussed above, the invention is also capable of generating bursts of amplified pulses having different amplitudes to provide an intentionally non-uniform amplitude profile. A specific non-uniform amplitude profile may be advantageous in a particular laser processing application. An example of such a non-uniform amplitude profile is set forth below with reference to FIG. 5A and FIG. 5B.

Figure 5A:
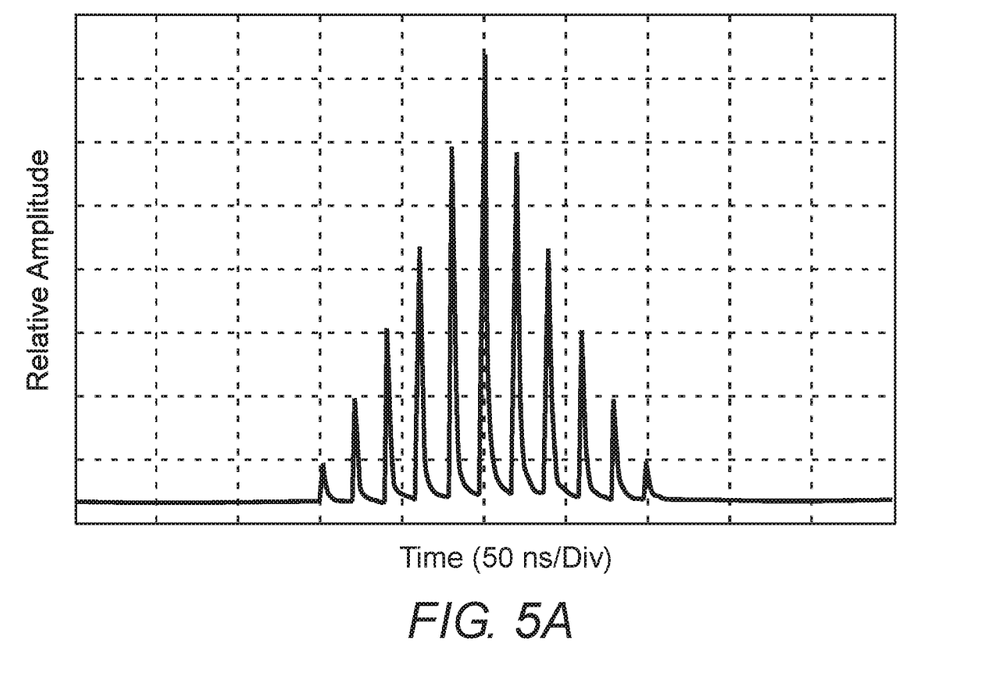
FIG. 5A is a graph schematically illustrating measured relative amplitude as a function of a time for a burst of eleven pulses, having equal temporal spacing and having amplitudes progressively increasing then progressively decreasing, generated in the apparatus of FIG. 1.

FIG. 5A is a graph schematically illustrating measured relative amplitude as a function of time for an amplified burst of eleven pulses, having equal temporal spacing and amplitudes that progressively increase then progressively decrease; what may be described as a "pyramidal" or "triangular" amplitude profile. The amplified burst was generated in the apparatus of FIG. 1 discussed above. The average output power is again 42 W and the PRF is again 200 kHz.

Figure 5B:
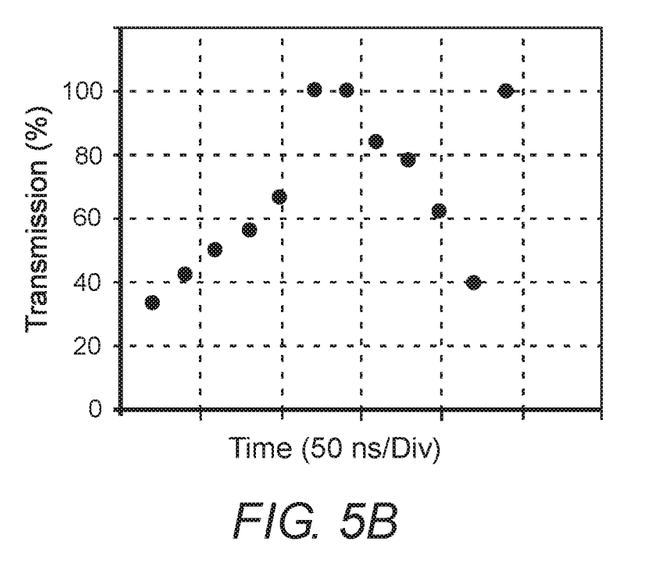
FIG. 5B is a graph schematically illustrating optical transmission of the optical modulator as a function of time during the generation of the amplified burst of FIG. 5A.

FIG. 5B is a graph schematically illustrating relative optical transmission of the optical modulator as a function of time during the generation of the amplified burst of FIG. 5A. The time-progressive percentage transmission levels, here, are 34.3, 42.5, 51.1, 55.7, 67.0, 100.0, 100.0, 84.0, 78.0, 61.8, 40.7, and 100.0, rounded to one decimal place.

In each of the three operational examples of the present invention, above, a measured amplified burst is illustrated followed by a graphical representation of the time-progressive percentage transmission levels during each pulse in the burst thereof. Together, they form a timing diagram. The inventors have found that other non-uniform amplitude profiles can be achieved using the present invention. By way of example, a saw-tooth shaped profile and another profile having amplitudes that progressively decrease then progressively increase.

The optical transmission levels are derived from a set of DC voltages at the twelve output channels 30 of parallel DAC 26 in controller 20 of FIG. 2. This set of DC voltages is effectively "stored" in the parallel DAC for at least the duration of the burst. The individual DC voltages are selected sequentially by parallel switch-array 40 in controller 20. A detailed description of this inventive action is set forth below with reference to FIGS. 2, 6A, and 6B. These drawings and the accompanying description illustrate how an analog stepped waveform can be delivered to optical modulator 14 of FIG. 1 by using a parallel DAC and a parallel switch-array having a total cost that could be one tenth or less than the cost of a fast DAC described in the above-referenced '027 patent.

Figure 6A:
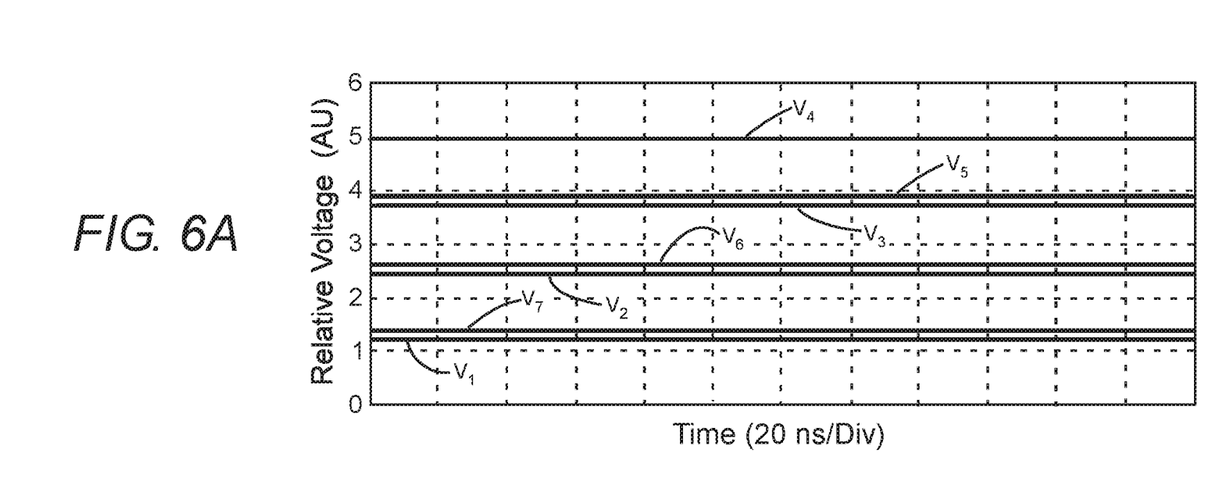
FIG. 6A is a graph schematically illustrating steady DC analog voltages at seven output channels of the parallel DAC and at the corresponding switches of the parallel switch-array in the circuit of FIG. 2 as a function of time.

FIG. 6A is a graph schematically illustrating steady DC analog voltages at seven output channels 30 of parallel DAC 26 in the circuit of FIG. 2. The DC voltages are identified generally as voltage levels $V_1$, $V_2$, $V_3$, $V_4$, $V_5$, $V_6$, and $V_7$. These voltage levels are communicated via low-pass filters 36 to the corresponding switches 42 of parallel switch-array 40. It can be seen that these voltage levels are constant for the duration of a burst. These voltage levels could be maintained through a plurality of bursts, until a new amplitude profile is required.

Figure 6B:
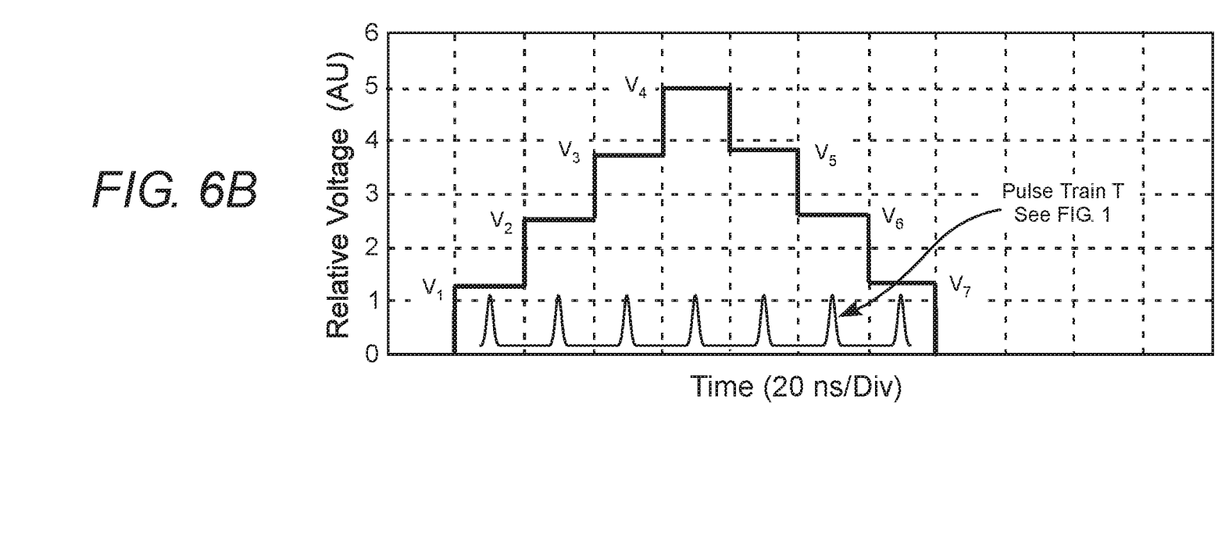
FIG. 6B is a graph schematically illustrating analog voltage at the output of the parallel switch-array of FIG. 6A as a function of time and seven seed pulses arriving at the optical modulator in the apparatus of FIG. 1 on the same time scale.

FIG. 6B is a graph schematically illustrating analog voltage as a function of time at the output of parallel switch-array 40; i.e. between the parallel switch-array and low-pass filter 44. The stepped waveform depicted is created by the parallel switch-array rapidly selecting output channels 30 of parallel DAC 26. Switches 42 operate sequentially at a high switching frequency, which is equal to the PRF of the seed pulses being received by optical modulator 14 of FIG. 1. The PRF is 50 MHz in this example.

Dashed vertical lines indicate "switch events" that are synchronized with respect to the arrival of seed pulses at the optical modulator, which can be referred to as "pulse events". There is a phase shift between switch events and pulse events. A portion of a pulse-train T is superimposed on the graph to illustrate this phase shift. The phase shift, here, is depicted as being about one-half of the 20 ns separation between seed pulses. However, the phase shift may be any convenient portion of the separation between seed pulses that reliably avoids switch events interfering with pulse events. An optimum phase shift for a particular laser-MOPA apparatus may be determined empirically, thereby accounting for normal operating delays of all the electronic components therein.

While the present invention described hereinabove has sequential switching through a numerical order of output channels 30, the sequential switching could be through any desired order of the output channels and the corresponding switches, without departing from the spirit and scope of the present invention. When a new amplitude profile is required, a new set of DC voltages for output channels 30 of parallel DAC 26 may be commanded by computer 22, while sequential switching of parallel switch-array 40 continues in the same order during subsequent bursts. Alternatively, the DC output channels may remain at the same constant voltage levels that are essentially stored in the parallel DAC, while sequential switching may be commanded to occur in a different order during subsequent bursts. The encoded digital signal sent from counter-encoder 52 to decoder 58 would thus further represent the switching order. The amplitude profile require for each burst is determined from the user input into computer 22 of controller 20.

The specific set of DC voltages for output channels 30 required to achieve a desired amplitude profile may be provided to computer 22 directly as user input. These DC voltages may be determined empirically for a burst having a particular length and amplitude profile. Alternatively, computer 22 may store one or more gain profiles, which represent depletion of stored energy during amplification of a burst in optical amplifier 16. The user input would include a desired amplitude profile for amplified burst $B_{AMP}$ and computer 22 would determine the required set of DC voltages.

Sequential switching does not preclude switching in an order that operates an individual switch 42 more than once during a burst. Similarly, for long bursts, each voltage step of analog modulation signal SA could determines the amplitude of two or more pulses in a burst thereof. Another advantage of the current invention is that it enables longer bursts containing more amplified pulses, by distributing available gain in the optical amplifier between all the amplified pulses desired in the burst.

In summary, the present invention is described above in terms of a preferred embodiment and operational examples. The invention, however, is not limited to the embodiments

What is claimed is:

1. Optical apparatus, comprising:
   a pulsed seed laser generating a train of seed pulses having a pulse repetition frequency;
   an optical modulator arranged to receive the train of seed pulses from the pulsed seed laser and to form a burst of seed pulses by selecting a plurality of consecutive seed pulses from the train of seed pulses, the optical modulator having an optical transmission specified by an analog modulation signal having a stepped waveform;
   an optical amplifier arranged to receive the burst of seed pulses from the optical modulator and to amplify the seed pulses;
   a parallel digital-to-analog converter having a plurality of output channels providing direct-current voltages that correspond to voltage steps of the stepped waveform; and
   a parallel switch-array connected in parallel with the output channels of the parallel digital-to-analog converter and arranged to deliver the analog modulation signal to the optical modulator;
   wherein the stepped waveform is formed by sequential switching of the parallel switch-array between the output channels of the parallel digital-to-analog converter.

2. The apparatus of claim 1, wherein the pulsed seed laser includes a mode-locked resonator.

3. The apparatus of claim 1, wherein the pulsed seed laser includes a directly-driven semiconductor laser.

4. The apparatus of claim 1, wherein the optical modulator is an acousto-optic modulator, the optical transmission of the acousto-optic modulator being about proportional to the analog modulator signal.

5. The apparatus of claim 1, wherein the optical modulator is an electro-optical modulator.

6. The apparatus of claim 1, wherein the optical amplifier is a fiber amplifier.

7. The apparatus of claim 1, wherein the parallel digital-to-analog converter and parallel switch-array are elements of a controller, the controller further comprising a computer, the computer sending a digital signal to control the direct-current voltages on the output channels of the parallel digital-to-analog converter in response to user input.

8. The apparatus of claim 7, wherein the controller further comprises a field-programmable gate-array, the computer communicating a required start time of the burst of seed pulses, a required duration of the burst of seed pules, and a desired phase shift for operation of the parallel switch-array with respect to the arrival of seed pulses at the optical modulator.

9. The apparatus of claim 7, wherein the controller further comprises a counter-encoder, the counter-encoder communicating an encoded digital signal to a decoder that is connected to the parallel switch-array, the encoded digital signal representing a number of switches of the parallel switch-array to be operated in sequence.

10. The apparatus of claim 9, wherein the encoded digital signal further represents a switching order.

11. The apparatus of claim 9, wherein the controller further comprises a phase-shift clock, the phase-shift clock advancing or retarding the encoded digital signal to achieve the desired phase shift.

12. The apparatus of claim 1, wherein the voltage steps of the stepped waveform cause stepwise changes in the optical transmission of the optical modulator, these stepwise changes in the optical transmission being synchronized with respect to the arrival of seed pulses at the optical modulator, the stepwise changes in the optical transmission being out of phase with the arrival of seed pulses at the optical modulator.

13. The apparatus of claim 12, wherein a phase shift between the stepwise changes in optical transmission and the arrival of seed pulses at the optical modulator is about one half of the separation between seed pulses.

14. The apparatus of claim 1, further including an array of low-pass filters and a low-pass filter, the filter array located between and in parallel connection with the parallel digital-to-analog converter and the parallel switch-array, the low-pass filter located between and in serial connection with the parallel switch-array and the optical modulator.

15. The apparatus of claim 1, further including a digital signal that initiates and terminates operation of the optical modulator.

16. The apparatus of claim 1, wherein the analog modulation signal has a progressively increasing waveform, the optical amplifier delivering a burst of amplified seed pulses having about equal amplitude.

17. The apparatus of claim 1, wherein the direct-current voltages are selected such that the optical amplifier delivers a burst of amplified seed pulses having amplitudes that progressively increase and then progressively decrease.

18. The apparatus of claim 1, wherein each direct-current voltage determines the amplitude of one amplified seed pulse in the burst thereof.

19. The apparatus of claim 1, wherein a change in amplitude profile of the amplified seed pulses is achieved by commanding a new set of direct-current voltages on the output channels of the parallel digital-to-analog converter.

20. The apparatus of claim 1, wherein a change in amplitude profile of the amplified seed pulses is achieved by commanding a different order of sequential switching.

* * * * *